(12) United States Patent
Hsu et al.

(10) Patent No.: US 11,201,227 B2
(45) Date of Patent: Dec. 14, 2021

(54) GATE STRUCTURE WITH BARRIER LAYER AND METHOD FOR FORMING THE SAME

(71) Applicant: Taiwan Semiconductor Manufacturing Co., Ltd., Hsinchu (TW)

(72) Inventors: Hsin-Yun Hsu, Taoyuan (TW); Hsiao-Kuan Wei, Longtan Township, Taoyuan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/964,769

(22) Filed: Apr. 27, 2018

(65) Prior Publication Data
US 2019/0334007 A1   Oct. 31, 2019

(51) Int. Cl.
*H01L 29/49* (2006.01)
*H01L 29/78* (2006.01)
*H01L 29/66* (2006.01)
*H01L 29/417* (2006.01)

(52) U.S. Cl.
CPC .... *H01L 29/4941* (2013.01); *H01L 29/41791* (2013.01); *H01L 29/4975* (2013.01); *H01L 29/66795* (2013.01); *H01L 29/785* (2013.01)

(58) Field of Classification Search
CPC ....... H01L 29/4941; H01L 29/49–4975; H01L 29/41791; H01L 29/66795
See application file for complete search history.

(56) References Cited

U.S. PATENT DOCUMENTS

| 4,684,542 | A | * | 8/1987 | Jasinski | H01L 21/28061 |
| | | | | | 257/E21.2 |
| 5,877,074 | A | * | 3/1999 | Jeng | H01L 21/28061 |
| | | | | | 257/E21.2 |
| 6,331,478 | B1 | * | 12/2001 | Lee | H01L 21/28114 |
| | | | | | 257/E21.2 |
| 6,582,757 | B1 | * | 6/2003 | Yen | H01L 21/28556 |
| | | | | | 257/E21.17 |
| 6,599,820 | B1 | * | 7/2003 | Kanda | H01L 21/28061 |
| | | | | | 257/E21.169 |
| 9,530,851 | B1 | * | 12/2016 | Lu | H01L 29/42364 |
| 2003/0104126 | A1 | * | 6/2003 | Fang | C23C 16/02 |
| | | | | | 427/255.392 |
| 2003/0157797 | A1 | * | 8/2003 | Hemer | H01L 21/28556 |
| | | | | | 438/652 |
| 2004/0207030 | A1 | * | 10/2004 | McTeer | H01L 21/28061 |
| | | | | | 257/412 |
| 2009/0053893 | A1 | * | 2/2009 | Khandelwal | C23C 16/45525 |
| | | | | | 438/680 |

(Continued)

*Primary Examiner* — Eric A. Ward
*Assistant Examiner* — Eric K Ashbahian
(74) *Attorney, Agent, or Firm* — Birch, Stewart, Kolasch & Birch, LLP (57) ABSTRACT

A semiconductor device structure is provided. The semiconductor device structure includes a first insulating layer over a substrate. A first metal layer is formed in the first insulating layer and over the substrate. A silicon- and fluorine-containing barrier layer is formed between the first insulating layer and the first metal layer and between the substrate and the first metal layer. The silicon- and fluorine-containing barrier layer has a silicon content in a range from about 5% to about 20%.

20 Claims, 7 Drawing Sheets

(56) References Cited

U.S. PATENT DOCUMENTS

| | | | |
|---|---|---|---|
| 2011/0298062 A1* | 12/2011 | Ganguli | H01L 21/28088 257/410 |
| 2015/0060844 A1* | 3/2015 | Miyairi | H01L 29/66795 257/43 |
| 2015/0061027 A1* | 3/2015 | Hong | H01L 27/092 257/369 |
| 2015/0255463 A1* | 9/2015 | Ando | H01L 21/225 257/371 |
| 2016/0093535 A1* | 3/2016 | Xu | H01L 21/02244 257/392 |
| 2017/0275180 A1* | 9/2017 | Liu | C01G 41/00 |
| 2018/0090438 A1* | 3/2018 | Kitamura | H01L 21/76883 |
| 2018/0211922 A1* | 7/2018 | Kim | H01L 23/53266 |
| 2018/0231690 A1* | 8/2018 | Byun | C08K 3/34 |

* cited by examiner

GATE STRUCTURE WITH BARRIER LAYER AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, more and more challenges from both fabrication and design issues have arisen.

Although existing semiconductor manufacturing processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device structure and a method for forming the same are provided. The semiconductor device structure includes an insulating layer formed over a substrate and a metal stack formed in the insulating layer and over the substrate. The metal stack includes a metal bulk layer, a work function metal layer, and a silicon-containing metal nucleation layer formed between the metal bulk layer and the work function metal layer, in accordance with some embodiments. The silicon-containing metal nucleation layer may have sufficient silicon content and serve as a barrier layer to prevent fluorine ions from diffusing into the work function metal layer.

Figure 1A:
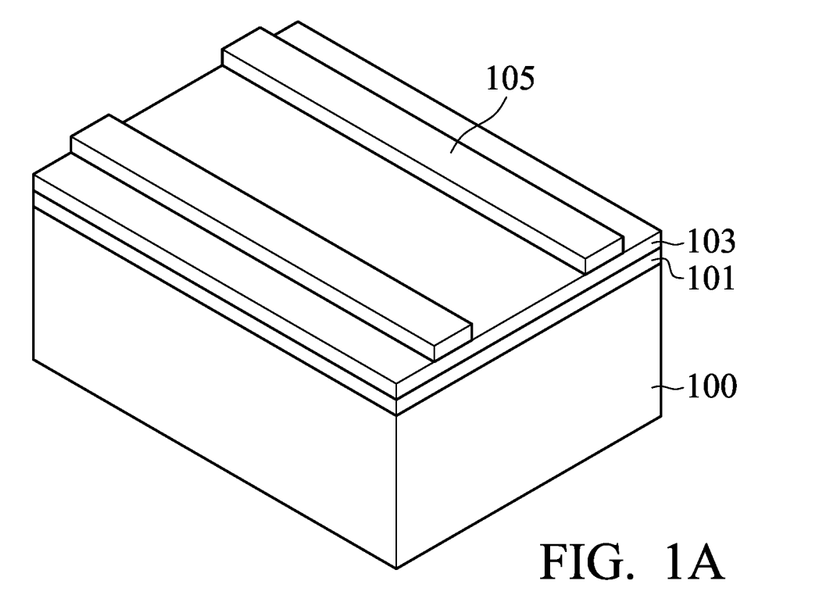
FIGS. 1A to 1J show perspective representations of various stages of forming a semiconductor device structure, in accordance with some embodiments of the disclosure.

FIGS. 1A to 1J show perspective representations of various stages of forming a semiconductor device structure, in accordance with some embodiments of the disclosure. In some embodiments, the semiconductor device structure is implemented as a fin field effect transistor (FinFET) structure. As shown in FIG. 1A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

Afterwards, a first masking layer 101 and a second masking layer 103 may be successively formed over the substrate 100, in accordance with some embodiments. In some embodiments, the first masking layer 101 serves a buffer layer or an adhesion layer that is formed between the underlying substrate 100 and the overlying second masking layer 103. In addition, the first masking layer 101 may be used as an etch stop layer when the second masking layer 103 is removed or etched.

In some embodiments, the first masking layer 101 is made of silicon oxide. In some embodiments, the first masking layer 101 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 103 is made of silicon oxide, silicon nitride, silicon oxynitride, or another applicable material. In some embodiments, the second masking layer 103 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the first masking layer 101 and the second masking layer 103, a patterned third masking layer 105 such as a photoresist layer may be formed over the second masking layer 103 for definition of one or more fin structures in the substrate 100. In some embodiments, the patterned third masking layer 105 is formed by a photolithography process. For example, the photolithography process may include photoresist coating (e.g., spin-on coating), soft baking, mask aligning, exposure, post-exposure baking, developing the photoresist, rinsing and drying (e.g., hard baking).

Figure 1B:
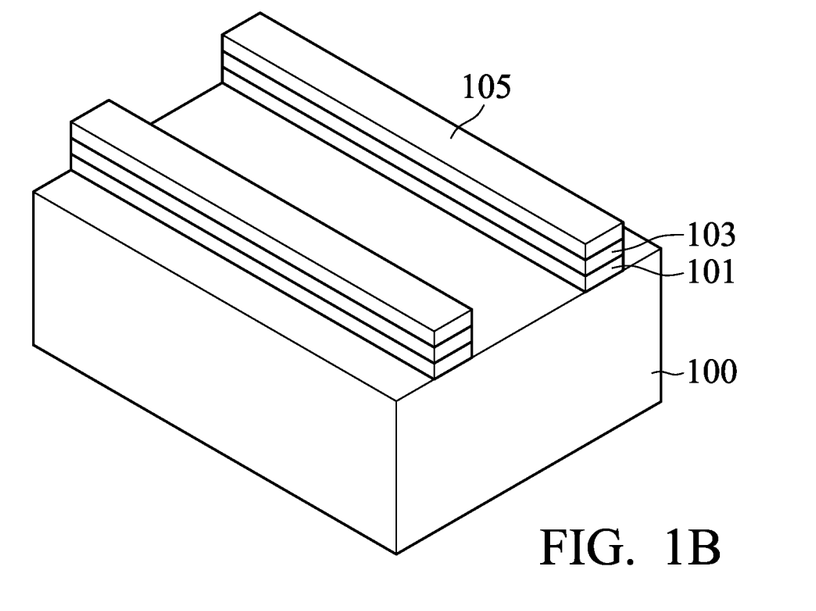

As shown in FIG. 1B, after the patterned third masking layer 105 is formed, the first masking layer 101 and the overlying second masking layer 103 are patterned by using the patterned third masking layer 105 as an etch mask, in accordance with some embodiments. As a result, a patterned first masking layer 101 and a patterned second masking layer 103 are formed, so as to expose portions of the substrate 100.

Figure 1C:
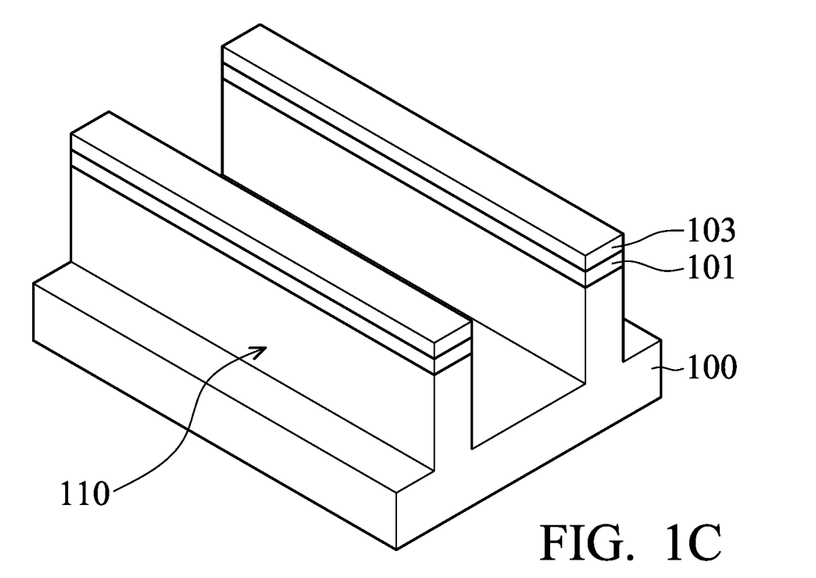

As shown in FIG. 1C, the patterned third masking layer 105 is removed after the substrate 100 are exposed by forming the patterned first masking layer 101 and the patterned second masking layer 103, in accordance with some embodiments. Afterwards, an etching process is performed on the substrate 100 to form fin structures 110 protruding from the substrate 100 and trenches in the substrate 100 by using the patterned first masking layer 101 and the patterned second masking layer 103 as an etch mask. In order to simplified the diagram, two fin structures 110 are depicted as an example.

In some embodiments, the etching process for formation of fin structures 110 is a dry etching process or a wet etching process. In an example, the substrate 100 is etched by a dry etching process, such as a reactive ion etching (RIE), neutral beam etching (NBE), the like, or a combination thereof. The dry etching process may be performed using a process gas including fluorine-based etchant gas. For example, the process gas may include $SF_6$, $C_xF_y$, $NF_3$ or a combination thereof. In some other embodiments, each of the fin structures 110 may have tapered sidewalls. For example, each of the fin structures 110 has a width that gradually increases from the top portion to the lower portion. A person of ordinary skill in the art will readily understand other methods of forming the fin structures, which are contemplated within the scope of some embodiments.

Figure 1D:
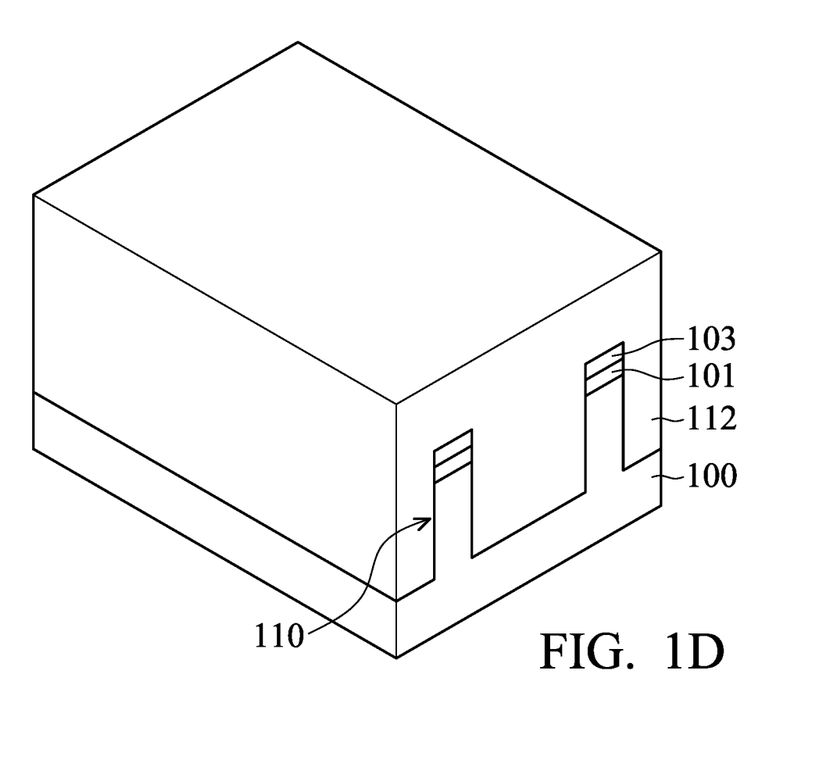

As shown in FIG. 1D, an insulating layer 112 is formed to cover the fin structures 110 protruding from the substrate 100, in accordance with some embodiments. In some embodiments, the insulating layer 112 is made of silicon oxide, fluoride-doped silicate glass (FSG), a low-k dielectric material, and/or another suitable dielectric material or another low-k dielectric material. The insulating layer 112 may be deposited by a chemical vapor deposition (CVD) process, a spin-on-glass process, or another applicable process.

In some other embodiments, an insulating liner structure (not shown) is formed on the sidewalls of the fin structures 110 and the bottom of the trenches in the substrate 100 prior to formation of the insulating layer 112. In some embodiments, the insulating liner structure may include a single layer or a multiple structure and may be made of silicon oxide, silicon nitride, silicon oxynitride, silicon carbide (SiC), or a combination thereof. The insulating liner structure may be deposited by a chemical vapor deposition (CVD) process or another applicable process.

Afterwards, the insulating layer 112 is thinned or planarized to expose the top surface of the patterned second masking layer 103, in accordance with some embodiments. For example, the insulating layer 112 is planarized by a chemical mechanical polishing (CMP) process. The patterned second masking layer 103 and the patterned first masking layer 101 are successively removed after the top surface of the patterned second masking layer 103 is exposed. In some embodiments, the patterned second masking layer 103 and the patterned first masking layer 101 are removed by one or more etching processes, so as to expose the top surfaces of the fin structures 110. In some embodiments, the patterned second masking layer 103 and the patterned first masking layer 101 are removed by a dry etching process, a wet etching process, or a combination thereof.

Figure 1E:
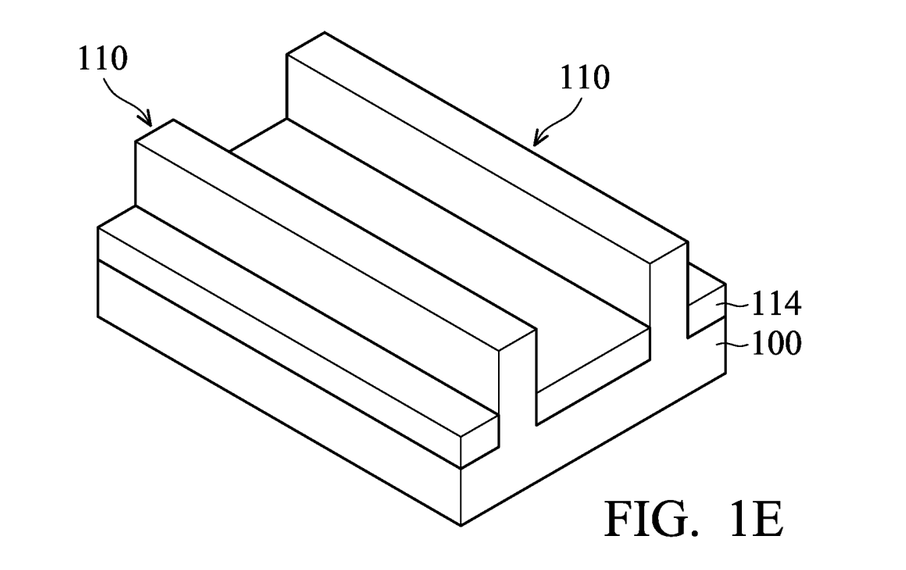

As shown in FIG. 1E, a portion of the insulating layer 112 is removed to form isolation features 114, in accordance with some embodiments. In some embodiments, each of the isolation features 114 includes the remaining insulating layer 112 and the insulating liner structure (not shown) surrounding the remaining insulating layer 112. The isolation features 114 may be shallow trench isolation (STI) structures surrounding the fin structures 110. A lower portion of each fin structure 110 is surrounded by the isolation features 114, and an upper portion of each fin structure 110 protrudes from the isolation features 114. In other words, a portion of the fin structure 110 is embedded in the isolation features 114. The isolation features 114 may prevent electrical interference or crosstalk.

Figure 1F:
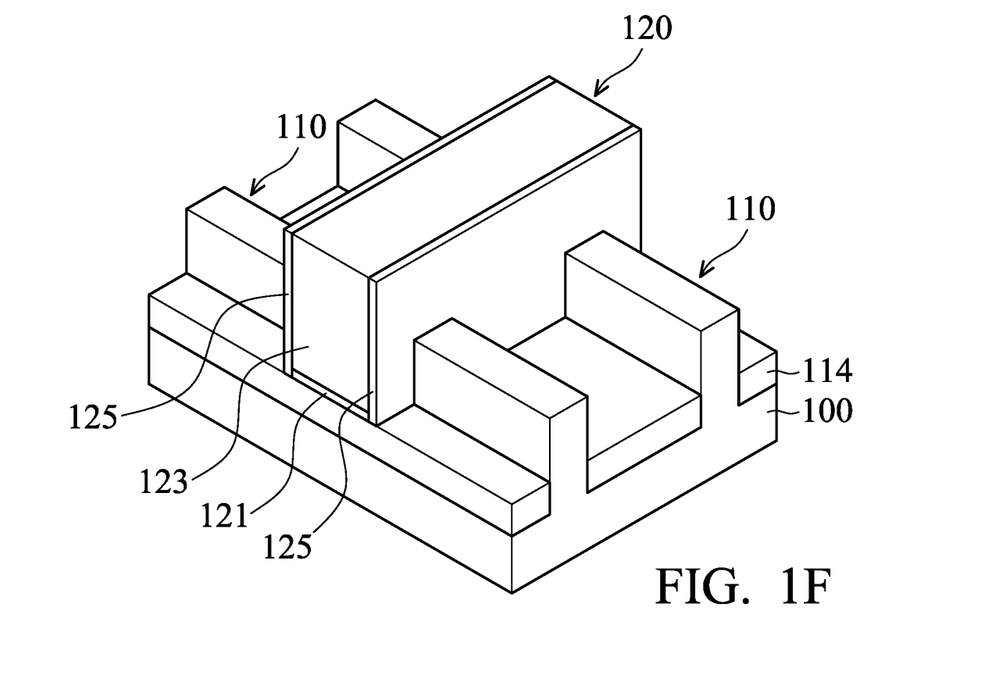

As shown in FIG. 1F, a dummy gate structure 120 is formed across the fin structures 110 and extends over the isolation features 114 after formation of the isolation features 114, in accordance with some embodiments. The dummy gate structure 120 may include a dummy gate insulating layer 121 and a dummy gate electrode layer 123 over the dummy gate insulating layer 121.

The dummy gate insulating layer 121 may be made of high-k dielectric materials, such as metal oxide in accordance with some embodiments. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the dummy gate insulating layer 121 may be formed by chemical vapor deposition (CVD), physical vapor deposition, (PVD), atomic layer deposition (ALD), or other applicable processes.

After the dummy gate insulating layer 121 is formed, the dummy gate electrode layer 123 is formed over dummy gate insulating layer 121, in accordance with some embodiments. In some embodiments, the dummy gate electrode layer 123 is made of polysilicon. Afterwards, the dummy gate insulating layer 121 and the dummy gate electrode layer 123 are patterned to form the dummy gate structure 120, in accordance with some embodiments.

Gate spacer layers 125 are formed on opposite sidewall surfaces of the dummy gate structure 120 after the dummy gate structure 120 is formed. The gate spacer layers 125 may be a single layer or multiple layers. In some embodiments, the gate spacer layers 125 are made of silicon nitride, silicon oxide, silicon carbide, silicon oxynitride, or another applicable material.

Figure 1G:
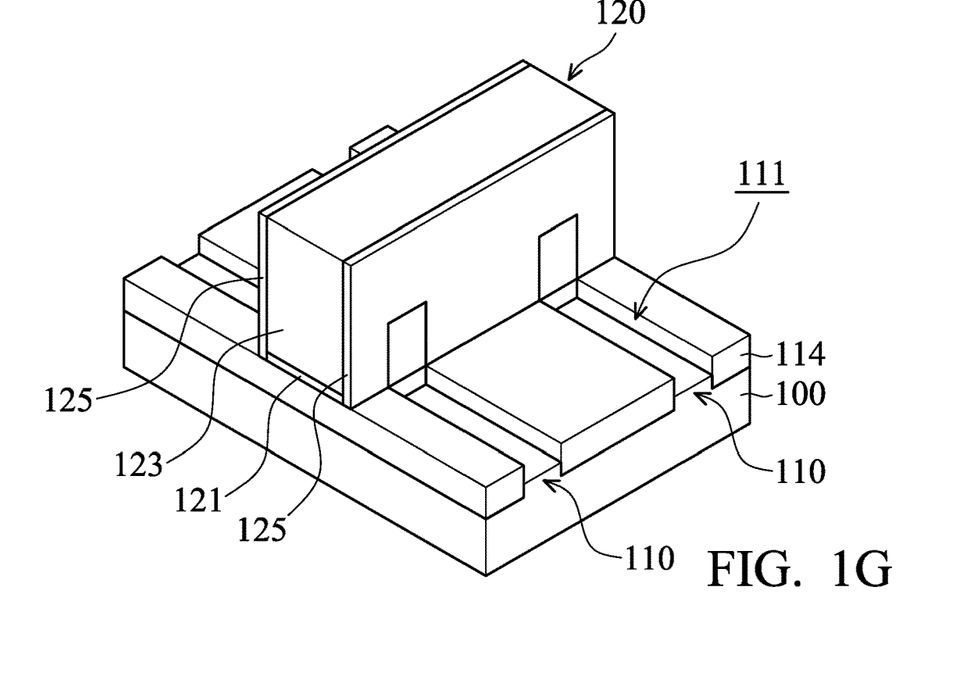

As shown in FIG. 1G, a recess 111 is formed in each of the fin structures 110 after the gate spacer layers 125 is formed, in accordance with some embodiments. In some embodiments, the recess 111 is formed by an etching process, so that the bottom surface of the recess 111 is lower than the top surface of the isolation feature 124.

Figure 1H:
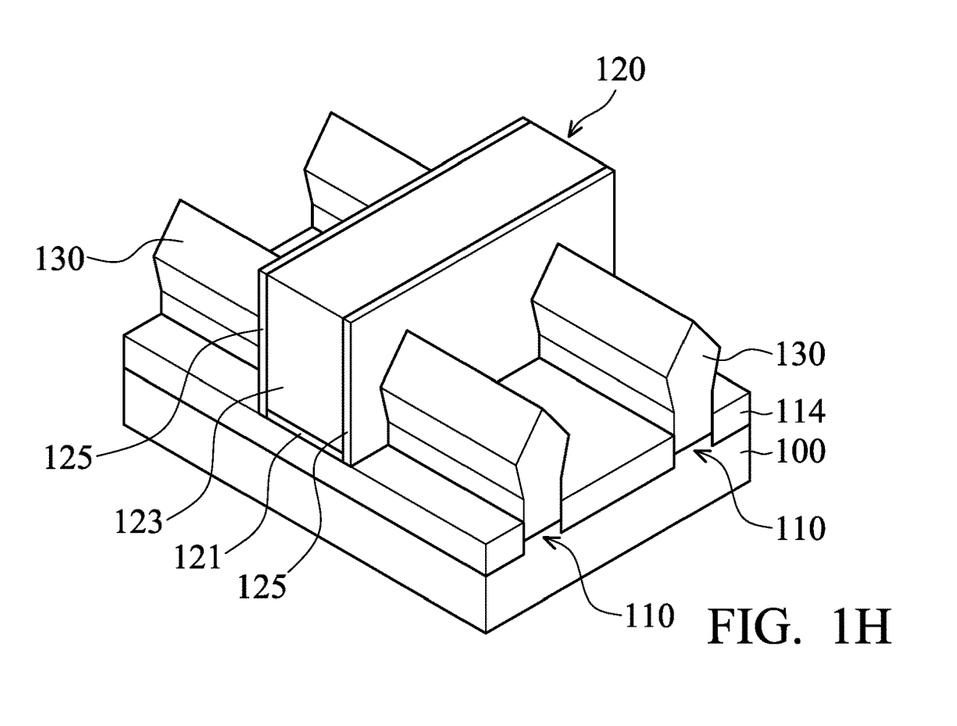

As shown in FIG. 1H, after the recess 111 is formed, a source/drain (S/D) feature 130 is formed in the recess 111 (indicated by FIG. 1G) of each fin structure 110 and protrudes from the recess 111, in accordance with some embodiments. In some embodiments, portions of the fin structure 110 adjacent to the dummy gate structure 120 are recessed to form recesses 111, and a strained material is grown in each recess 111 of the fin structure 110 by an epitaxial process to form the S/D features 130. The S/D features 130 are formed over the fin structure 110 on opposing sidewall surfaces of the gate structure 120.

In some embodiments, the lattice constant of the strained material may be different from the lattice constant of the substrate 100. In some embodiments, the S/D feature 130 includes Ge, SiGe, InAs, InGaAs, InSb, GaAs, GaSb, InAlP, InP, or the like.

Figure 1I:
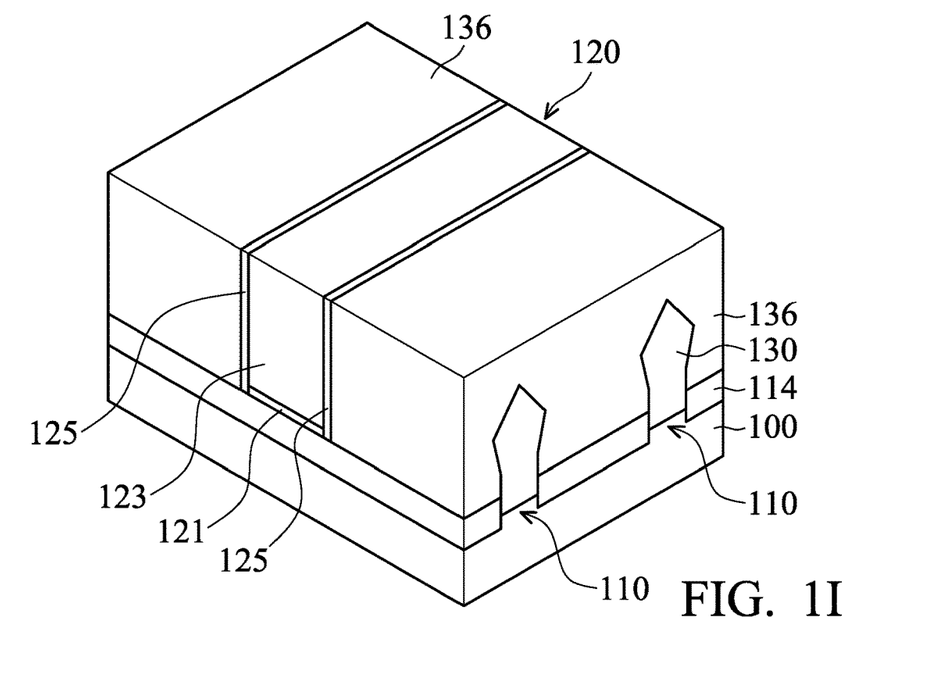

As shown in FIG. 1I, after the S/D feature 130 is formed, a contact etch stop layer (not shown) is formed over the substrate 100, and an insulating layer 136 (e.g., an inter-layer dielectric (ILD) layer) is formed over the contact etch stop layer, in accordance with some embodiments. In some embodiments, the contact etch stop layer is made of silicon nitride, silicon oxynitride, and/or other applicable materials. The contact etch stop layer may be formed by plasma enhanced chemical vapor deposition (PECVD), low-pressure chemical vapor deposition (LPCVD), atomic layer deposition (ALD), or other applicable processes.

In some embodiments, the insulating layer 136 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The insulating layer 136 may be formed by chemical vapor deposition (CVD), physical vapor deposition, (PVD), atomic layer deposition (ALD), spin-on coating, or another applicable process.

Afterwards, a planarization process is performed on the insulating layer 136 until the top surface of the dummy gate structure 120 is exposed. In some embodiments, the insulating layer 136 is planarized by a polishing process, such as a chemical mechanical polishing (CMP) process.

Figure 1J:
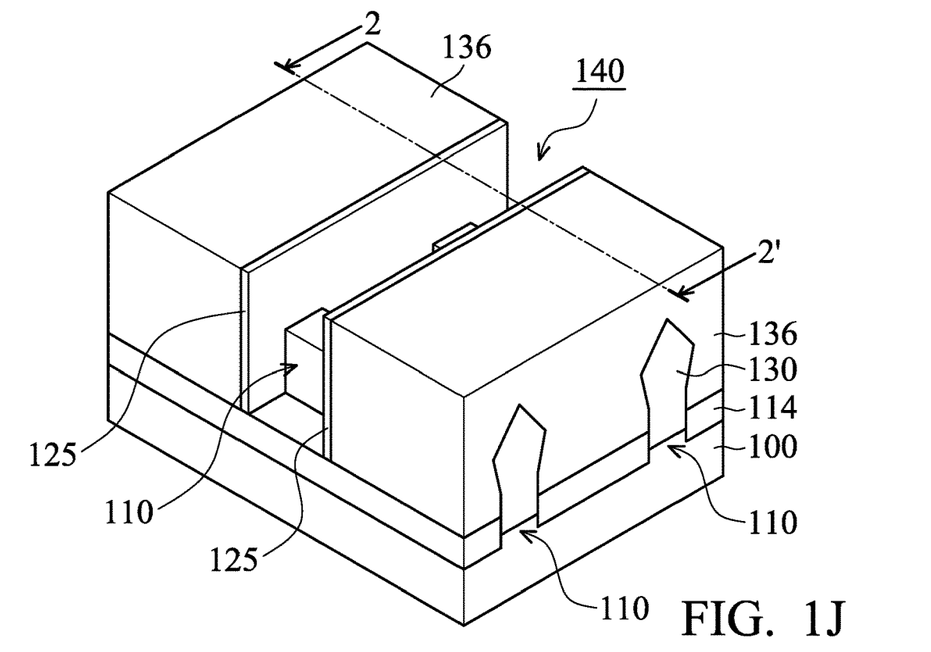

As shown in FIG. 1J, the dummy gate structure 120 is removed to form an opening 140 in the insulating layer 136 after the insulating layer 136 is planarized and the dummy gate structure 120 is exposed, in accordance with some embodiments. The dummy gate insulating layer 121 and the dummy gate electrode layer 123 are removed by an etching process, such as a dry etching process or a wet etching process.

Figure 2A:
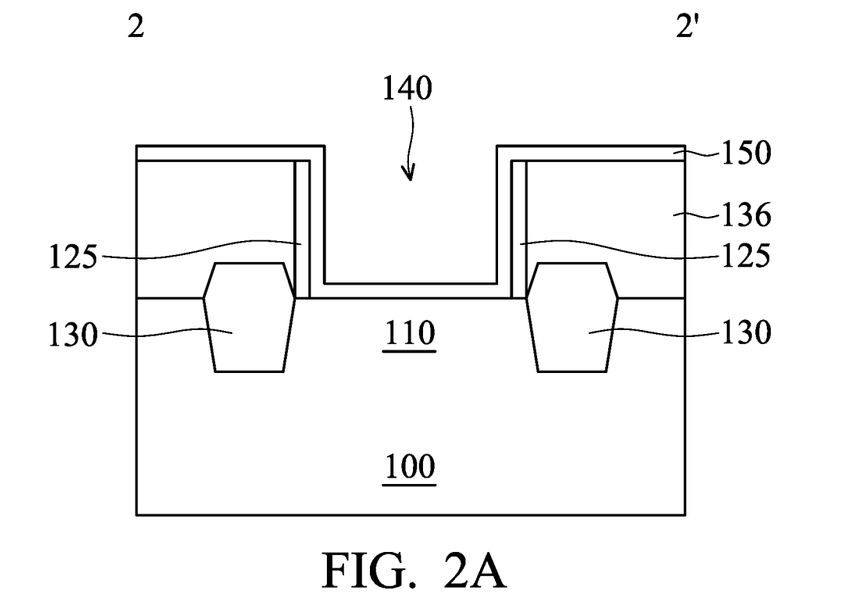
FIGS. 2A to 2D show cross-sectional representations of various stages of forming the semiconductor device structure after the structure of FIG. 1J, in accordance with some embodiments of the disclosure.

FIGS. 2A to 2D show cross-sectional representations of various stages of forming a semiconductor device structure 200 after the structure of FIG. 1J, in accordance with some embodiments of the disclosure. FIG. 2A shows a cross-sectional representation taken along line 2-2' of the structure shown in FIG. 1J.

As shown in FIG. 2A, the structure shown in FIG. 1J is provided, in accordance with some embodiments. In some embodiments, the structure includes a substrate 100 having a fin structure 110 protruding therefrom. The S/D features 130 are formed over the fin structure 110. An insulating layer 136 (e.g., an inter-layer dielectric (ILD) layer) is formed over the substrate 100 to cover the fin structure 110 and the S/D features 130. An opening 140 is formed in the insulating layer 136 by removing the dummy gate structure 120 (as shown in FIG. 1I) to expose the fin structure 110 between the S/D features 130, so that the S/D features 130 are on opposing sidewall surfaces of the opening 140.

In some embodiments, gate spacer layers 125 are formed on opposite sidewall surfaces of the opening 140. Afterwards, a gate structure is formed in opening 140, in accordance with some embodiments. In some embodiments, the gate structure at least includes a gate insulating layer, a work functional metal layer, and a gate electrode layer.

As shown in FIG. 2A, a gate insulating layer 150 is formed over the insulating layer 136 and conformally covers the inner surface of the opening 140, in accordance with some embodiments. The gate insulating layer 150 formed in the opening 140 may cover the gate spacers 140 and the exposed fin structure 110 between the S/D features 130. In some embodiments, the gate insulating layer 150 is made of a high k dielectric material, such as metal oxide. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the gate insulating layer 150 may be formed by chemical vapor deposition (CVD), physical vapor deposition, (PVD), atomic layer deposition (ALD), or another applicable process.

In some other embodiments, an interfacial layer (not shown) is formed prior to formation of the gate insulating layer 150. The interfacial layer is formed between the exposed fin structure 110 and the gate insulating layer 150, so as to improve the adhesion of the gate insulating layer 150. In some embodiments, the interfacial layer is made of $SiO_2$. In some embodiments, the interfacial layer is formed by an atomic layer deposition (ALD) process, a thermal oxidation process, chemical vapor deposition (CVD) process, or another applicable process.

Figure 2B:
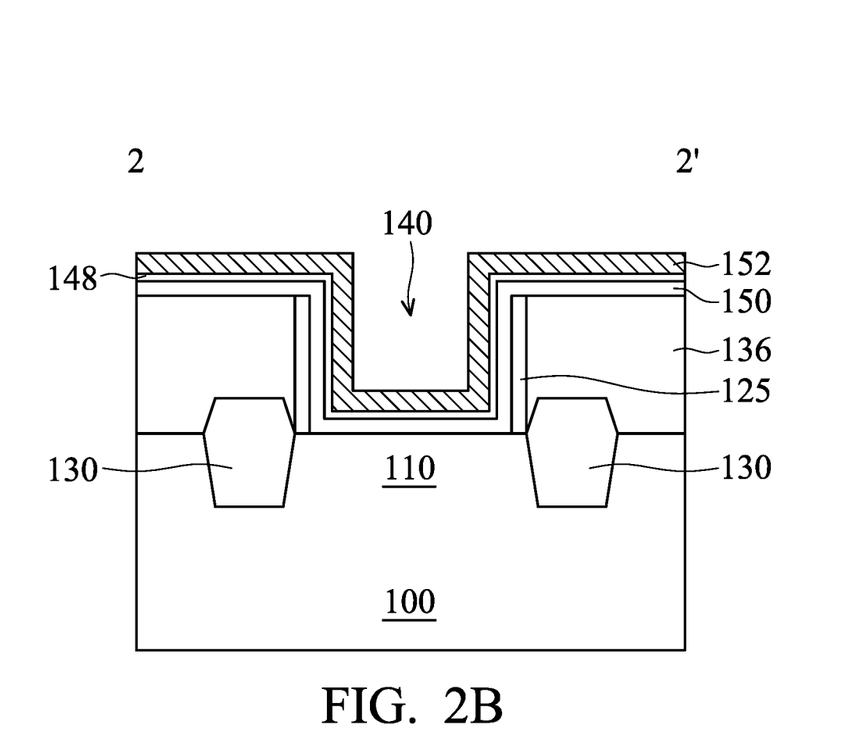

As shown in FIG. 2B, after the gate insulating layer 150 is formed, a work function metal layer 152 is conformally formed over the insulating layer 136 and conformally covers the inner surface of the opening 140 that is covered by the gate insulating layer 150, in accordance with some embodiments. The work function metal layer 152 is tuned to have a proper work function. In some embodiments, the work function metal layer 152 is made of N-type work function metal or P-type work function metal. The N-type work function metal includes titanium aluminum alloy (TiAl), titanium aluminum nitride (TiAlN), titanium aluminum carbide (TiAlC), tantalum carbon nitride (TaCN), or a combination thereof. The P-type work function metal includes titanium nitride (TiN), tungsten nitride (WN), tantalum nitride (TaN), or a combination thereof. In some embodiments, the work function metal layer 152 is formed by atomic layer deposition (ALD), sputtering, physical vapor deposition (PVD), or another applicable process.

In some other embodiments, a conformal capping or barrier layer 148 is formed over the gate insulating layer 150 prior to formation of the work function metal layer 152, so that the capping or barrier layer 148 is between gate insulating layer 150 and the work function metal layer 152. The capping or barrier layer 148 is employed to prevent the metal formed over it from penetrating into the channel region of the fin structure 110 below metal gate structure. In some embodiments, the capping or barrier layer 148 is made of metal nitride. Examples of the metal nitride may include TiN, TaN, and WN. The capping or barrier layer 148 may be formed by physical vapor deposition, (PVD), atomic layer deposition (ALD), or another applicable process.

Figure 2C:
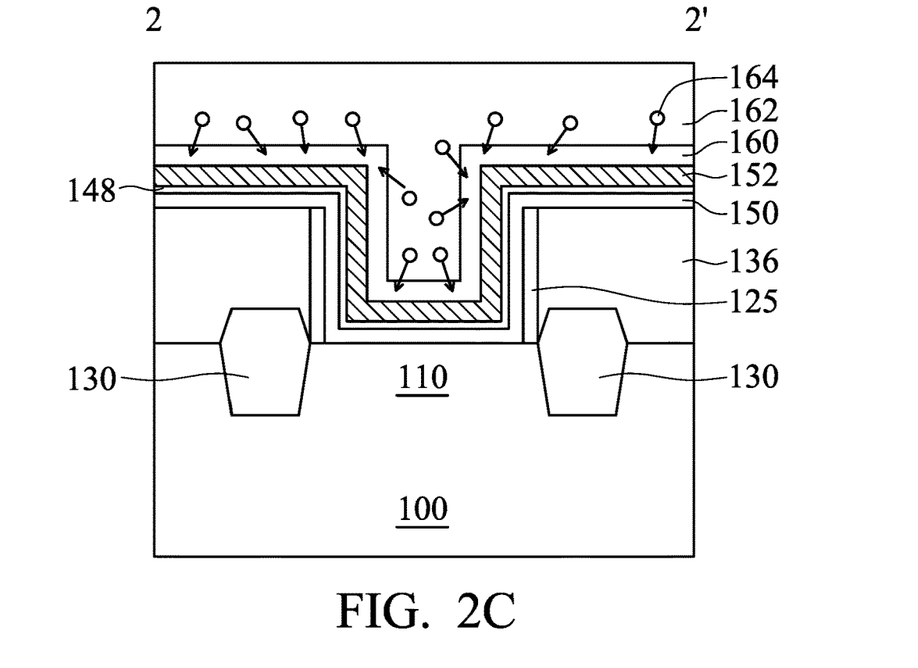

As shown in FIG. 2C, after the work function metal layer 152 is formed, a metal nucleation layer 160 is formed over the insulating layer 136 and conformally covers the work function metal layer 152, in accordance with some embodiments. Afterwards, a metal bulk layer 162 is formed over the metal nucleation layer 160 and filling the opening 140 (as indicated in FIG. 2B) of the insulating layer 136, in accordance with some embodiments.

As a result, the gate insulating layer 150 is formed between the insulating layer 136 and the metal nucleation layer 160 and between the substrate 100 and the metal nucleation layer 160. Moreover, the work function metal layer 152 is formed between the insulating layer 136 and the metal nucleation layer 160 and between the substrate 100 and the metal nucleation layer 160. Additionally, the metal nucleation layer 160 is formed between the work function metal layer 152 and the metal bulk layer 162 and between the substrate 100 and the metal bulk layer 162. The adhesion of the metal bulk layer 162 can be improved due to the formation of the metal nucleation layer 160. In some embodiments, the metal nucleation layer 160 has a thickness in a range from about 20 Å to about 50 Å. The overlying metal bulk layer 162 has a thickness in a range from about 1400 Å to about 2000 Å.

In some embodiments, the metal nucleation layer 160 and the overlying metal bulk layer 162 are made of the same metal material, such as tungsten (W). In some embodiments, the metal nucleation layer 160 that is made of tungsten includes silicon and is referred to as a silicon-containing metal nucleation layer. The silicon-containing metal nucleation layer 160 may be formed by physical vapor deposition, (PVD), atomic layer deposition (ALD), or another applicable process. In some embodiments, the silicon-containing metal nucleation layer 160 is formed by an atomic layer deposition (ALD) process using a process gas at least including a refractory metal-containing gas (such as tungsten hexafluoride ($WF_6$)) and a silicon-containing gas (such as silane ($SiH_4$), disilane ($Si_2H_6$), or dichlorosilane ($SiCl_2H_2$)). Tungsten hexafluoride ($WF_6$) serves a tungsten source gas and silane ($SiH_4$) disilane ($Si_2H_6$), or dichlorosilane ($SiCl_2H_2$) serves as a silicon source gas and a reducing gas. In some other embodiments, the silicon-containing metal nucleation layer 160 is formed by an atomic layer deposition (ALD) process using a process gas at least including a tungsten source gas (e.g., $WF_6$)), a reducing gas (e.g., borane ($BH_3$), diborane ($B_2H_6$), or hydrogen gas ($H_2$)), and a silicon source gas (e.g., $SiH_4$, ($Si_2H_6$, or $SiCl_2H_2$). As a result, the refractory metal-containing gas may undergo a reduction reaction, thereby forming the silicon-containing metal nucleation layer 160.

In some embodiments, a carrier gas (such as an inert gas (e.g., argon)) is added into the process gas during the formation of the silicon-containing metal nucleation layer 160, so that the silicon-containing gas is diluted in the carrier gas. Therefore, the silicon content in the formed silicon-containing metal nucleation layer 160 can be adjusted by increasing or reducing the flow rate of the silicon-containing gas or the carrier gas. In some embodiments, the silicon-containing metal nucleation layer 160 has a silicon content not less than 5%. In some embodiments, the silicon-containing metal nucleation layer 160 has a silicon content in a range from about 5% to about 20%.

In some embodiments, the metal bulk layer 162 is formed by chemical vapor deposition (CVD), high density plasma CVD (HDPCVD), metal organic CVD (MOCVD), plasma enhanced CVD (PECVD), or another applicable process. In some embodiments, the metal bulk layer 162 that is made of tungsten is formed by a chemical vapor deposition (CVD) process using a process gas at least including a refractory metal-containing gas (such as tungsten hexafluoride ($WF_6$)) and a hydrogen-containing gas (such as $H_2$). $WF_6$ gas serves a tungsten source gas and $H_2$ gas serves as a reducing gas. Similarly, $WF_6$ gas may undergo a reduction reaction, thereby forming the metal bulk layer 162. In some embodiments, an inert carrier gas (such as argon (Ar)) is added during the deposition of the metal bulk layer 162.

The fluorine-containing gas (i.e., $WF_6$ gas) may form fluorine-containing byproduct during the formation of the metal bulk layer, so that fluorine ions from the fluorine-containing byproduct may pass through the metal nucleation layer and then diffuse into the work function metal layer. The fluorine ions may react with the work function metal, so as to vary the threshold voltage of the subsequently formed transistor (e.g., FINFET). Typically, the threshold voltage is increased with the increased amount of the fluorine ions in the work function metal layer.

However, in some embodiments, the silicon-containing metal nucleation layer 160 may serve as a barrier layer or a blocking layer between the work function metal layer 152 and the metal bulk layer 162. More specifically, during the formation of the metal bulk layer 162, fluorine ions 164 from the fluorine-containing byproduct may diffuse into the silicon-containing metal nucleation layer 160. Since there is high affinity between silicon and fluorine, silicon-fluorine (Si—F) bonds are formed in the silicon-containing metal nucleation layer 160. Therefore, the silicon-containing metal nucleation layer 160 can be employed to prevent the fluorine ions in the byproduct (which is generated during the metal bulk layer 162 deposition) from diffusing toward the work function metal layer 152 below. Accordingly, the silicon-containing metal nucleation layer 160 is also referred to as a silicon- and fluorine-containing barrier layer.

In some embodiments, the silicon- and fluorine-containing barrier layer 160 has a silicon content not less than 5%. In some embodiments, the silicon- and fluorine-containing barrier layer 160 has a silicon content in a range from about 5% to about 20%. The sufficient silicon content in the silicon-containing metal nucleation layer 160 is designed to effectively prevent the fluorine ions 164 from diffusing into toward the work function metal layer 152 below. Accordingly, the threshold voltage of the subsequently formed transistor can be prevent from being varied by controlling the silicon content in the silicon-containing metal nucleation layer 160.

Additionally, the critical dimension (CD) of the opening 134 (as indicated in FIG. 2A) may be varied due to the process variation. When the CD of the opening 134 is varied, the threshold voltage of the subsequently formed transistor may be varied. Therefore, the sufficient silicon content in the silicon-containing metal nucleation layer (or silicon- and fluorine-containing barrier layer) 160 is also designed to effectively reduce the impact of the process variation.

Figure 2D:
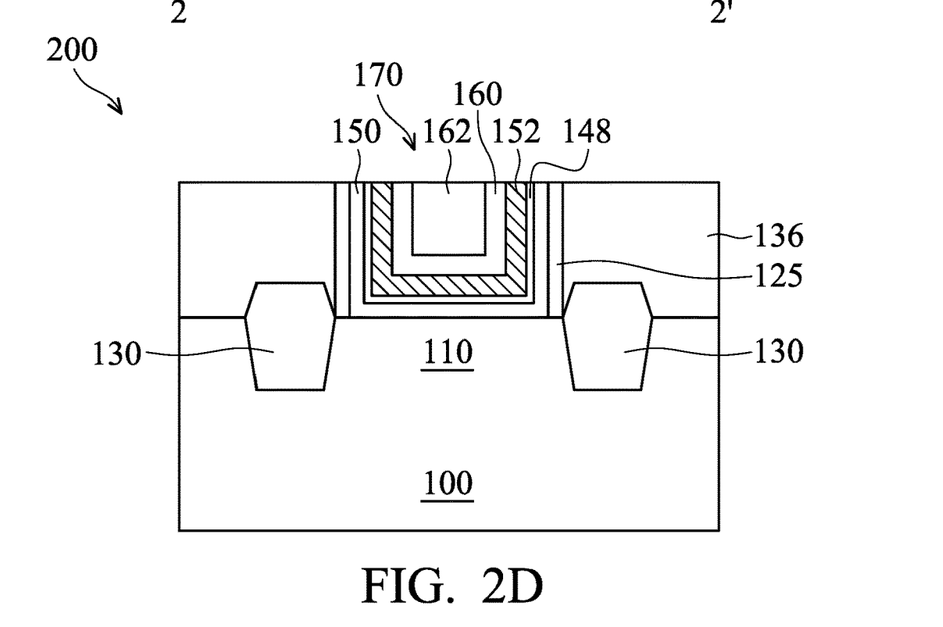

As shown in FIG. 2D, after the metal bulk layer 162 is formed, the metal bulk layer 162, the silicon- and fluorine-containing barrier layer, the work function metal layer 152, and the gate insulating layer 150 over the insulating layer 136 are successively removed, in accordance with some embodiments. For example, the metal bulk layer 162, the metal nucleation layer 160, the work function metal layer 152, and the gate insulating layer 150 over the insulating layer 136 are successively removed by a chemical mechanical polishing (CMP) process to expose a top surface of the insulating layer 136. The remaining layers form a gate structure 170 for a FINFET device.

Embodiments of a semiconductor device structure and a method for forming the same are provided. The semiconductor device structure includes a gate structure that is formed in an insulating layer over a substrate. The formation of the gate structure includes forming a work function metal layer, a metal bulk layer and a metal nucleation layer between the work function metal layer and the metal bulk layer. The metal nucleation layer is formed using a silicon-containing gas, so as to form a silicon-containing metal nucleation layer with sufficient silicon content. This metal nucleation layer prevents fluorine ions from diffusing toward the work function metal layer below. Accordingly, the threshold voltage of the subsequently formed transistor can be prevent from being varied by controlling the silicon content in the silicon-containing metal nucleation layer.

In some embodiments, a semiconductor device structure is provided. The semiconductor device structure includes a first insulating layer over a substrate. The semiconductor device structure further includes a first metal layer formed in the first insulating layer and over the substrate. The semiconductor device structure further includes a silicon- and fluorine-containing barrier layer formed between the first insulating layer and the first metal layer and between the substrate and the first metal layer. The silicon- and fluorine-containing barrier layer has a silicon content in a range from about 5% to about 20%.

In some embodiments, a semiconductor device structure is provided. The semiconductor device structure includes a fin structure protruding from a substrate and a gate structure formed over the substrate. The gate structure includes a gate insulating layer over the fin structure. The gate structure further includes a work function metal layer over the gate insulating layer. The gate structure further includes a silicon-containing metal nucleation layer over the work function metal layer. The gate structure further includes a metal bulk layer over the silicon-containing metal nucleation layer. The metal bulk layer and the silicon-containing metal nucleation layer are made of the same metal material and the silicon-containing metal nucleation layer has a silicon content in a range from about 5% to about 20%.

In some embodiments, a method for forming a semiconductor device structure is provided. The method includes providing a fin structure protruding from a substrate. The method further includes forming a first insulating layer over a substrate and having an opening that exposes the fin structure. The method further includes forming a work function metal layer to conformally cover an inner surface of the opening. The method further includes forming a silicon-containing metal nucleation layer to conformally cover the work function metal layer. The method further includes forming a metal bulk layer over the silicon-containing metal nucleation layer and filling the opening using a fluorine-containing gas, so that fluorine ions generated by the formation of the metal bulk layer diffuse into the silicon-containing metal nucleation layer to form silicon-fluorine bonds. The silicon-containing metal nucleation layer has a silicon content in a range from about 5% to about 20%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first insulating layer over a substrate;
a first metal layer formed in the first insulating layer and over the substrate;
a silicon- and fluorine-containing barrier layer formed between the first insulating layer and the first metal layer and between the substrate and the first metal layer;
a second metal layer formed between the first insulating layer and the silicon- and fluorine-containing barrier layer and in direct contact with the silicon- and fluorine-containing barrier layer, wherein the second metal layer is an N-type work function metal layer;
a metal nitride layer formed between the first insulating layer and the second metal layer; and
a metal oxide layer sandwiched between the substrate and the metal nitride layer,
wherein the silicon- and fluorine-containing barrier layer has a silicon content in a range from about 5% to about 20%, wherein the silicon- and fluorine-containing barrier layer is a metal layer with silicon dopants and fluorine dopants, and wherein the silicon- and fluorine-containing barrier layer has a thickness in a range from about 20 Å to about 50 Å, and
wherein the metal nitride layer is in direct contact with the metal oxide layer, and the silicon- and fluorine-containing barrier layer is in direct contact with the second metal layer.

2. The semiconductor device structure as claimed in claim 1, wherein the second metal layer is formed between the substrate and the silicon- and fluorine-containing barrier layer.

3. The semiconductor device structure as claimed in claim 2, wherein the second metal layer is made of TiAlN or TaCN.

4. The semiconductor device structure as claimed in claim 2, wherein the metal nitride layer is made of WN or TaN.

5. The semiconductor device structure as claimed in claim 1, wherein the first metal layer is a metal bulk layer.

6. The semiconductor device structure as claimed in claim 5, wherein the silicon- and fluorine-containing barrier layer and the metal bulk layer comprise tungsten.

7. The semiconductor device structure as claimed in claim 1, wherein the silicon- and fluorine-containing barrier layer comprises silicon-fluorine bonds formed therein.

8. The semiconductor device structure as claimed in claim 1, wherein the first metal layer has a thickness in a range from about 1400 Å to about 2000 Å.

9. The semiconductor device structure as claimed in claim 1, further comprising:
 a fin structure protruding from a substrate; and
 a source/drain feature formed over the fin structure;
 wherein a bottom surface of the metal oxide layer vertically over the isolation feature is lower than a top surface of the source/drain feature and is higher than a bottom surface of the source/drain feature.

10. A semiconductor device structure, comprising:
 a fin structure protruding from a substrate; and
 a gate structure formed over the substrate, comprising:
  a gate insulating layer over the fin structure, wherein the gate insulating layer is made of metal oxide;
  a metal nitride layer over and in direct contact with the gate insulating layer;
  a work function metal layer over and in direct contact with the metal nitride layer, wherein the work function metal layer is an N-type work function metal layer;
  a silicon-containing metal nucleation layer over and in direct contact with the work function metal layer; and
  a metal bulk layer over the silicon-containing metal nucleation layer,
 wherein the metal bulk layer and the silicon-containing metal nucleation layer are made of the same metal material, wherein the silicon-containing metal nucleation layer is a metal layer with silicon dopants and fluorine dopants and has a silicon content in a range from about 5% to about 20%, and wherein the silicon-containing metal nucleation layer has a thickness in a range from about 20 Å to about 50 Å, and
 wherein the work function metal layer is sandwiched between the metal nitride layer and the silicon-containing metal nucleation layer.

11. The semiconductor device structure as claimed in claim 10, wherein the metal material comprises tungsten.

12. The semiconductor device structure as claimed in claim 10, wherein the work function metal layer is made of TiAlN or TaCN.

13. The semiconductor device structure as claimed in claim 10, further comprising:
 a gate spacer layer formed on a sidewall of the gate structure; and
 an insulating layer formed around the gate spacer layer, wherein the gate spacer layer is in direct contact with the gate insulating layer and the insulating layer.

14. A method of forming a semiconductor device structure, comprising:
 forming a fin structure protruding from a substrate;
 forming a first insulating layer over the substrate and having an opening that exposes the fin structure;
 forming a metal nitride layer to conformally cover an inner surface of the opening;
 forming a work function metal layer to conformally cover the metal nitride layer in the opening, wherein the work function metal layer is an N-type work function metal layer;
 forming a silicon-containing metal nucleation layer with silicon dopants to conformally cover an exposed top surface of the work function metal layer; and
 forming a metal bulk layer over the silicon-containing metal nucleation layer and filling the opening using a fluorine-containing gas, so that fluorine ions generated by the formation of the metal bulk layer diffuse into the silicon-containing metal nucleation layer to form fluorine dopants in the silicon-containing metal nucleation layer,
 wherein the silicon-containing metal nucleation layer is a metal layer with silicon-fluorine bonds generated by the silicon dopants and fluorine dopants formed therein and has a silicon content in a range from about 5% to about 20%, and wherein the silicon-containing metal nucleation layer has a thickness in a range from about 20 Å to about 50 Å, and
 wherein the silicon-containing metal nucleation layer is formed by an atomic layer deposition process, and the atomic layer deposition process comprises using a metal-containing gas, a silicon-containing gas, a reducing gas, and an inert gas, and the metal-containing gas comprises $WF_6$, the silicon-containing gas comprises $SiCl_2H_2$, the inert gas comprises Ar, and the reducing gas comprises borane or $H_2$.

15. The method as claimed in claim 14, wherein the metal bulk layer is formed by a chemical vapor deposition process.

16. The method as claimed in claim 14, further comprising forming a second insulating layer to conformally cover the inner surface of the opening prior to the formation of the work function metal layer.

17. The method as claimed in claim 14, further comprising:
 forming a first masking layer over the substrate;
 forming a second masking layer over the first masking layer;
 forming a patterned third masking layer over the second masking layer;
 patterning the second masking layer and the first masking layer through the patterned third masking layer to expose portions of the substrate;
 removing the patterned third masking layer; and
 etching the substrate exposed by the second masking layer and the first masking layer to form the fin structure.

18. The method as claimed in claim 17, further comprising:
 forming an insulating layer covering the first masking layer, the second masking layer, and the fin structure;
 polishing the insulating layer to expose the second masking layer;
 removing the second masking layer and the first masking layer; and
 removing upper portions of the insulating layer to form an isolation feature around the fin structure.

19. The method as claimed in claim 14, wherein the work function metal layer is made of TiAlN or TaCN.

20. The method as claimed in claim 19, wherein the metal nitride layer is made of WN or TaN.

* * * * *